(12) United States Patent
Yamada et al.

(10) Patent No.: US 6,618,424 B1
(45) Date of Patent: Sep. 9, 2003

(54) OPTICAL PICKUP DEVICE

(75) Inventors: Masato Yamada, Inuyama (JP); Yoichi Tsuchiya, Hashima (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/533,975

(22) Filed: Mar. 23, 2000

(30) Foreign Application Priority Data

Mar. 25, 1999 (JP) ............................................ 11-081808

(51) Int. Cl.⁷ .................................................. H01S 3/08

(52) U.S. Cl. ........................ 372/101; 372/102; 372/108

(58) Field of Search ................................ 372/101, 102, 372/108

(56) References Cited

U.S. PATENT DOCUMENTS 5,805,556 A * 9/1998 Lee et al. ..................... 369/103
5,966,355 A * 10/1999 Kamiyama ..................... 369/44
6,128,134 A * 10/2000 Feldman et al. ............. 359/565

OTHER PUBLICATIONS

Photo Technica "Circular Beam Semiconductor Laser" Japanese Publication 1997.

* cited by examiner

Primary Examiner—Paul Ip
Assistant Examiner—Armando Rodriguez
(74) Attorney, Agent, or Firm—Armstrong, Westerman & Hattori, LLP

(57) ABSTRACT

An optical pickup device includes a semiconductor laser, a collimater lens, an optical member, a halfmirror, an objective lens, a collecting lens and a photodetector. The collimator lens collimates a laser beam from the semiconductor laser. The optical member diffracts the laser beam which has been collimated by the collimator lens outward along the direction of the shorter diameter of the laser beam, and emits a laser beam having a prescribed aspect ratio. The halfmirror passes the laser beam from optical member and reflects one half the light reflected from a signal recording surface of an optical disk to the photodetector. The objective lens focuses the laser beam on the signal recording surface. The collective lens collects the laser beam from the halfmirror. The photodetector detects the laser beam. Therefore, the optical pickup device is capable of converting the aspect ratio of the laser beam emitted from the semiconductor laser, and hence it becomes possible to irradiate the optical disk with the laser beam having sufficient power for recording a signal.

10 Claims, 9 Drawing Sheets

OPTICAL PICKUP DEVICE

BACKGROUND OF THE INVENTION

1. Field of the Invention

The present invention relates to an optical pickup for recording and/or reproducing a signal to/from an optical disk.

2. Description of the Background Art

A CD (Compact Disk) and the like having recessed pits arranged on a recording surface of an optical disk and allowing reproduction of digital audio signals and video signals by modulating dimension of the recessed pits dependent on the information to be recorded has been widely used. A CD-R (Recordable) having the same recording capacity as a CD and allowing recording only once has also been in the market. Further, a high density, reproduction-only DVD (Digital Video Disk) recording signals by the arrangement of pits similar to a CD and having the storage capacity of 4.7 Gbytes on one side and 9.4 Gbytes on both sides has also been put on the market. A DVD-RAM (Random Access Memory) has also been developed as a recordable optical disk having the same storage capacity as the DVD. Further, standard for a magneto-optical recording medium having the diameter of 12 cm and the storage capacity of 6 Gbytes has been established for practical application as a recordable optical disk.

When a signal is to be reproduced from an optical disk such as the CD, CD-R, DVD, DVD-RAM and the magneto-optical recording medium, a signal recording surface of the optical disk is irradiated with a laser beam, and change in intensity of the light reflected from the signal recording surface is detected. In this case, the necessary laser beam power is 0.2 to 1 mW. When a signal is to be recorded by the laser beam on the CD-R, DVD-RAM or the magneto-optical recording medium as a recordable optical disk, the power of several mW is necessary.

Referring to FIG. 1, a laser beam emitted from a semiconductor laser has an elliptical shape in a plane orthogonal to an optical axis (cross section), and the shorter diameter 130 is much different from the longer diameter 131. When a signal is to be recorded on an optical disk by using the laser beam, it is necessary to collect the laser beam by an objective lens. When the shorter diameter 143 of a laser beam 141 is shorter than the pupil diameter of an objective lens 140, while it is possible to well converge the laser beam along the direction of the longer diameter 142 of laser beam 141, it is impossible to sufficiently converge the beam along the direction 143 of the shorter diameter. As a result, the signal recording surface of the optical disk is irradiated with the laser beam having the elliptical shape, which leads to poor recording characteristic. When the shorter diameter 143 is made larger than the pupil diameter of objective lens 140 so as to sufficiently converge the laser in the shorter diameter 143 as well, the efficiency in using the laser beam lowers.

In view of the foregoing, an optical pickup has been adopted in which a laser beam emitted from a semiconductor laser 1 is collimated by a collimater lens 150, aspect ratio, that is, the ratio of the shorter diameter to the longer diameter of the beam is converted to such a value that ensures sufficient convergence of the laser beam both in the directions of the shorter and longer diameters by a beam shaping prism 151 or a cylindrical lens 155, and the beam enters an objective lens 152 and directed to an optical disk 6, as shown in FIGS. 3 and 4. When the optical disk 6 is irradiated with the laser beam by such a method, both the shorter and longer diameters of laser beam 153 are longer than the diameter of objective lens 153, and therefore the laser beam 153 can sufficiently be converged.

In the optical pickup shown in FIG. 3, however, the laser beam comes to have the optical axis changed after emission from the semiconductor laser 1 until being incident on optical disk 6, and therefore, it is difficult to align the optical axis. Further, the optical pickup shown in FIG. 4 has a number of optical components, and therefore it is difficult to fabricate a compact optical pickup.

SUMMARY OF THE INVENTION

An object of the present invention is to provide an optical pickup device capable of irradiating an optical disk with a laser beam having sufficient power to record a signal.

According to the present invention, the optical pickup device includes a laser, an objective lens and an optical member. The laser generates a laser beam having an elliptical cross section. The objective lens focuses the laser beam on an optical recording medium. The optical member is provided between the laser and the objective lens, and converts the laser beam from the laser to a beam having a desired aspect ratio by diffracting the laser beam outward along the direction of the shorter diameter of the beam. Therefore, it is possible for the objective lens to sufficiently converge the laser beam. As a result, efficiency in using the laser beam is improved, and the optical recording medium can be irradiated with the laser beam having sufficient power to record a signal.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
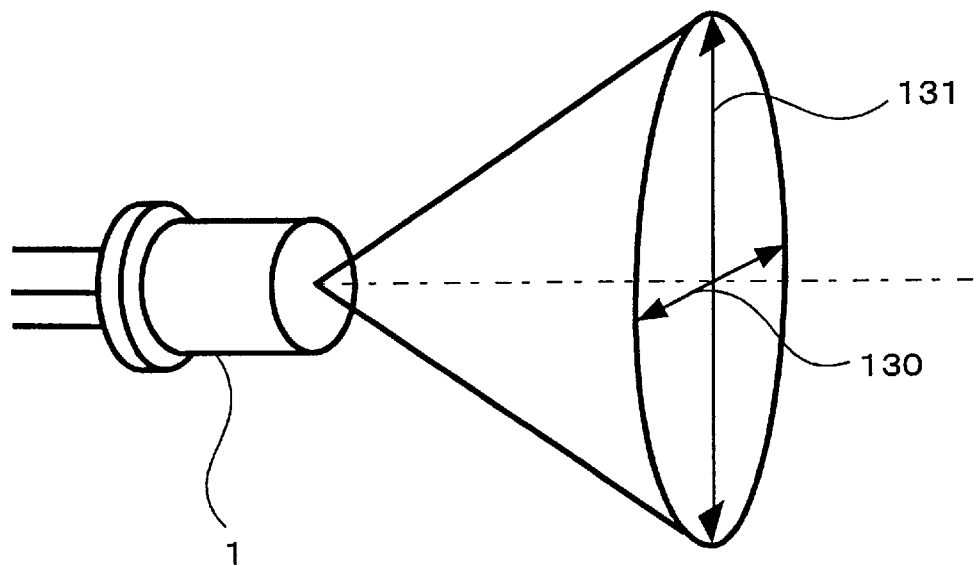
FIG. 1 is a perspective view representing a shape of a laser beam emitted from a semiconductor laser in a plane orthogonal to the optical axis of the laser beam.
Figure 2:
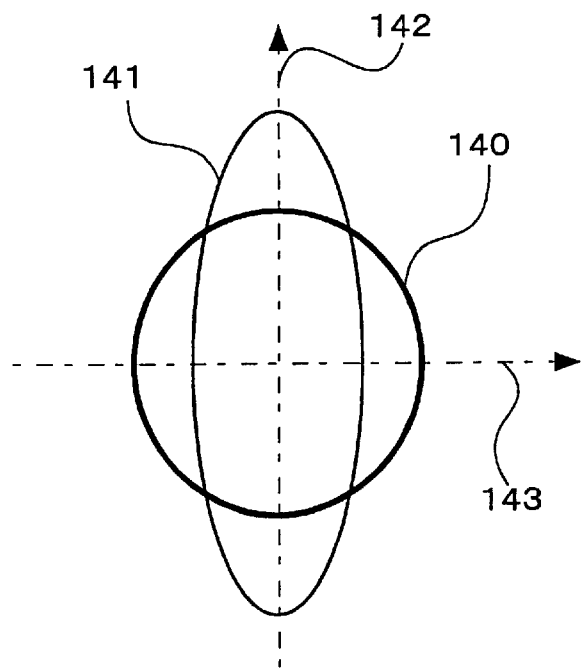
FIG. 2 is an illustration showing a problem experienced when the shorter diameter of the laser beam is shorter than the diameter of an objective lens.
Figure 3:
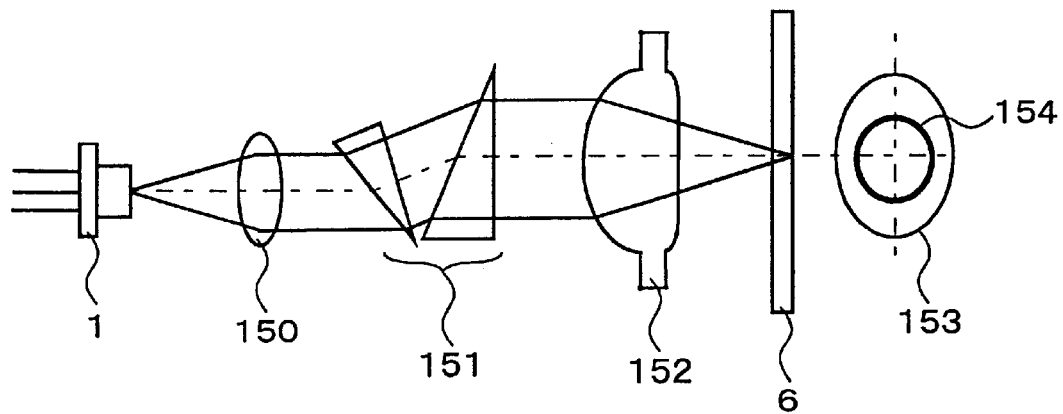
FIG. 3 shows an example of a conventional optical pickup in which the aspect ratio of the laser beam is converted.
Figure 4:
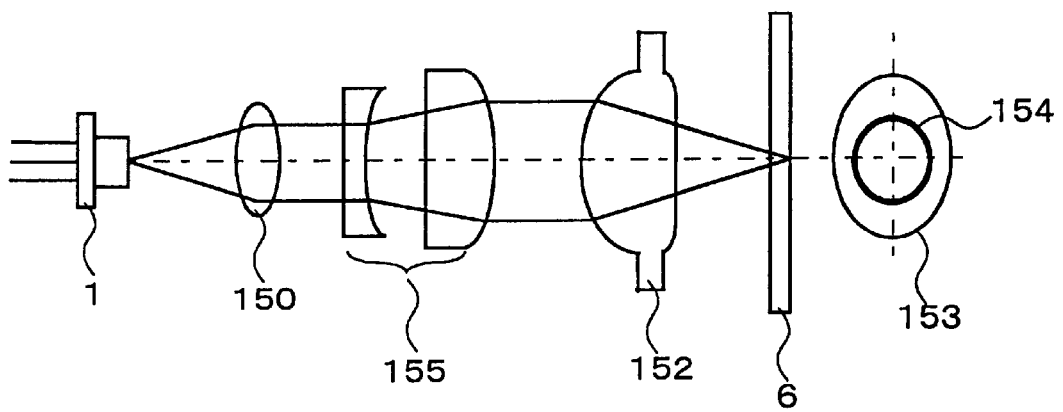
FIG. 4 shows another example of a conventional pickup in which the aspect ratio of the laser beam is converted.

Embodiments of the present invention will be described with reference to the figures. In the figures, corresponding portions are denoted by the same reference characters, and description thereof will not be repeated.

Figure 5:
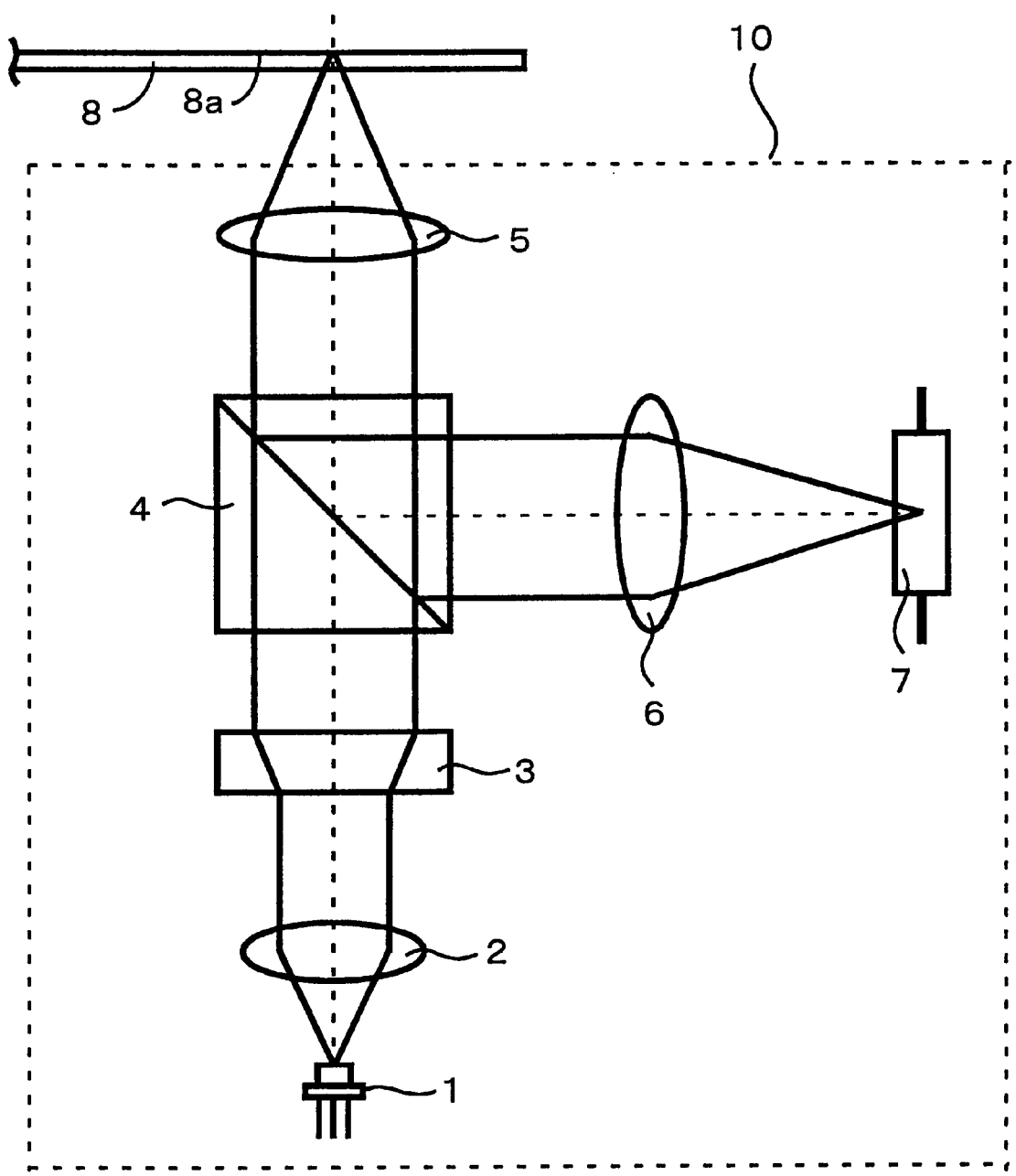
FIG. 5 shows a configuration of an optical pickup device in accordance with an embodiment of the present invention.

Referring to FIG. 5, the configuration of an optical pickup device in accordance with an embodiment of the present invention will be described. An optical pickup 10 includes: a semiconductor laser 1 generating a laser beam having a wavelength of 635 nm (tolerance 15±nm, which is the same in the following); a collimater lens 2 collimating the laser beam emitted from semiconductor laser 1; an optical member 3 receiving the laser beam collimated by collimater lens 2 and diffracting the laser beam outward along the shorter diameter to convert aspect ratio of the laser beam; a half mirror 4 transmitting the laser beam from optical member 3 and reflecting half of the light reflected from a signal recording surface 8a of an optical disk 8 in a direction at an angle of 90°; an objective lens 5 collecting the laser beam which has passed through half mirror 4 and directing the beam to the signal recording surface 8a of optical disk 8; a collective lens 6 collecting the laser beam reflected by half mirror 4; and a photodetector 7 detecting the reflected light.

Optical pickup 10 is characterized in that it has the optical member which converts the aspect ratio of the laser beam from semiconductor laser 1 to a prescribed aspect ratio, so that the optical disk 8 is irradiated with the laser beam having sufficient power to record a signal on optical disk 8. As the optical member 3 is used as a component, the shorter diameter of the laser beam entering the objective lens 5 is made larger than the pupil diameter of the objective lens 5, whereby the laser beam can be collected with high efficiency. As a result, it becomes possible to direct the laser beam having sufficient power to record a signal to the signal recording surface 8a of the optical disk 8.

Figure 6:
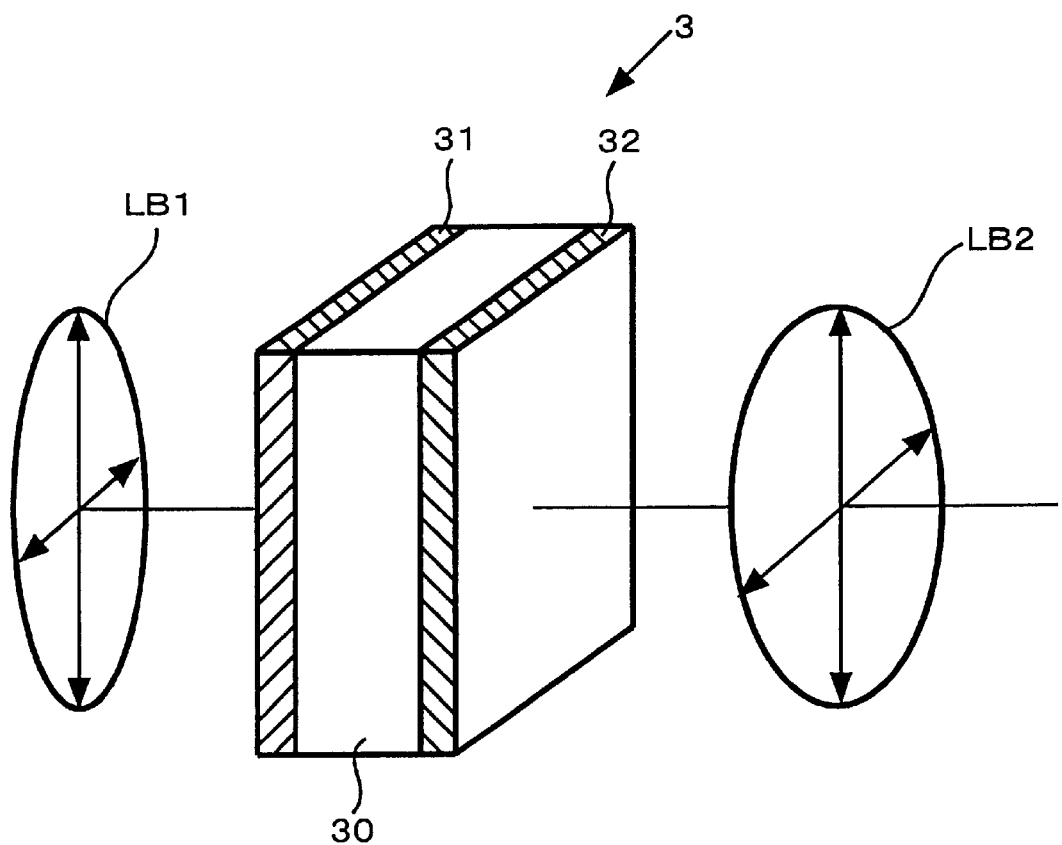
FIG. 6 is a perspective view representing configuration and function of an optical member shown in FIG. 5.

Referring to FIG. 6, the function of optical member 3 will be described. Optical member 3 includes a transparent substrate 30 formed of glass or the like, an optical element 31 formed on a laser beam entering side of transparent substrate 30, and an optical element 32 formed on a laser beam exiting side of transparent substrate 30. A laser beam LB1 having the wavelength of 635 nm has an aspect ratio, that is, the ratio of the shorter diameter to the longer diameter of 1:2.5. Optical member 3 diffracts the laser beam LB1 emitted from semiconductor laser 3 and collimated by collimater lens 2 and having the aspect ratio of 1:2.5 outward along the direction of the shorter diameter, so that the laser beam is converted to a laser beam LB2 having a desired aspect ratio. Here, the optical element 31 diffracts the laser beam LB1 outward along the direction of the shorter diameter, and optical element 32 collimates the laser beam which has been diffracted by the optical element 31. When a signal is to be recorded on a DVD-RAM or a magneto-optical recording medium by using a laser beam having the wavelength of 635 nm, the desired aspect ratio is 1:1.

Figure 7:
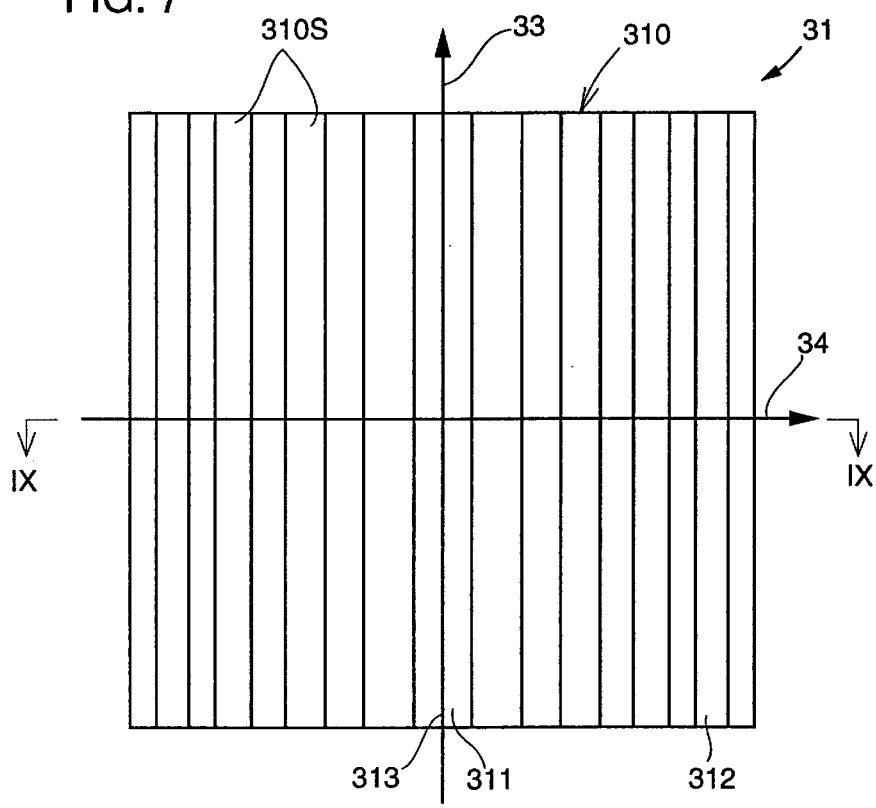
FIG. 7 is a plan view representing a light entering side of the optical member shown in FIG. 6.
Figure 8:
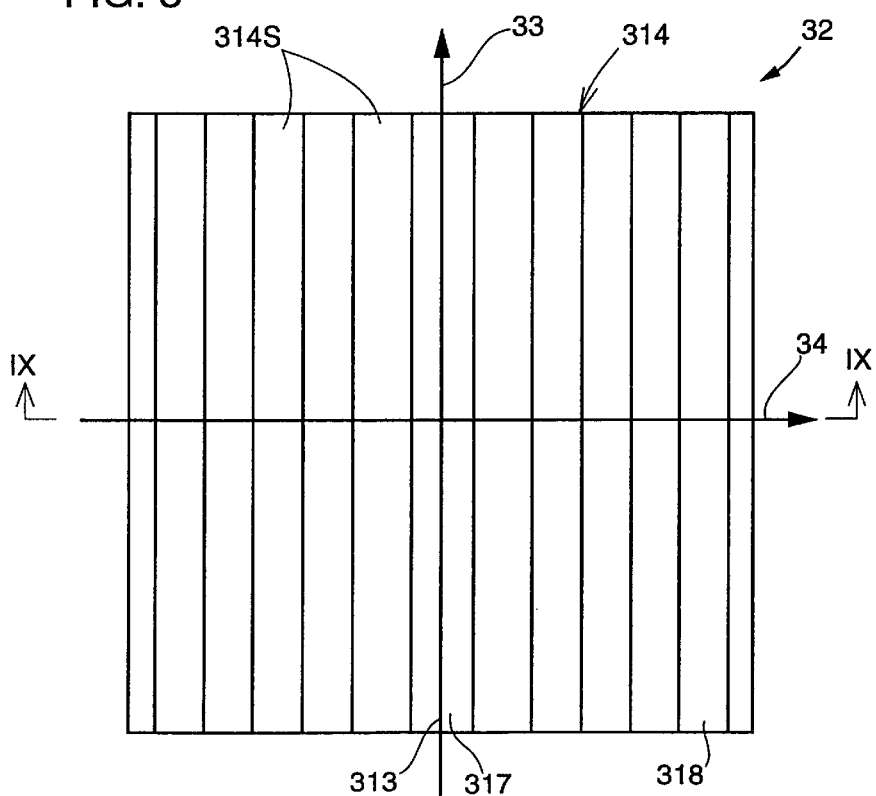
FIG. 8 is a plan view showing a light exiting side of the optical member shown in FIG. 6.

Referring to FIGS. 7 and 8, planar structure of optical member 3 will be described. FIG. 7 is a plan view on the side of the optical element 31 of optical member 3, and FIG. 8 is a plan view of optical member 3 on the side of optical element 32. An arrow 33 represents the direction along the longer diameter of the laser beam, and an arrow 34 represents the direction along the shorter diameter of the laser beam.

Referring to FIG. 7, optical element 31 is formed by a hologram lens 310 consisting of a number of stripe members 310S. The stripe members 310S are arranged parallel to the direction 33 of the longer diameter of the laser beam. The space (pitch) between each of the stripe members 310S is the widest at the center 313 and gradually becomes narrower to the outside along the direction 34 of the shorter axis of the laser beam. The width of the stripe members 310S is the widest at the center 313 and gradually becomes narrower to the outside along the direction 34 of the shorter diameter of the laser beam, within the range of 3.8 to 62 μm. The space (pitch) of the stripe members 310S is 62 μm at the innermost periphery 311, and 3.8 μm at the outermost periphery 312.

Referring to FIG. 8, optical member 32 is also formed by a hologram lens 314 consisting of a number of stripe members 314S. Stripe members 314S are also arranged parallel to the direction 33 of the longer diameter of the laser beam. The space (pitch) between the stripe members 314S is widest at the center 313 and becomes gradually narrower to the outside along the direction 34 of the shorter diameter of the laser beam. The width of the stripe member 314S is the widest at the center and becomes gradually narrower to the outside along the direction 34 of the shorter diameter of the laser beam within the range of 3.8 to 97 μm. The space (pitch) between the stripe member 314S is 97 μm at the innermost periphery 317 and 3.8 μm at the outermost periphery 312.

Figure 9:
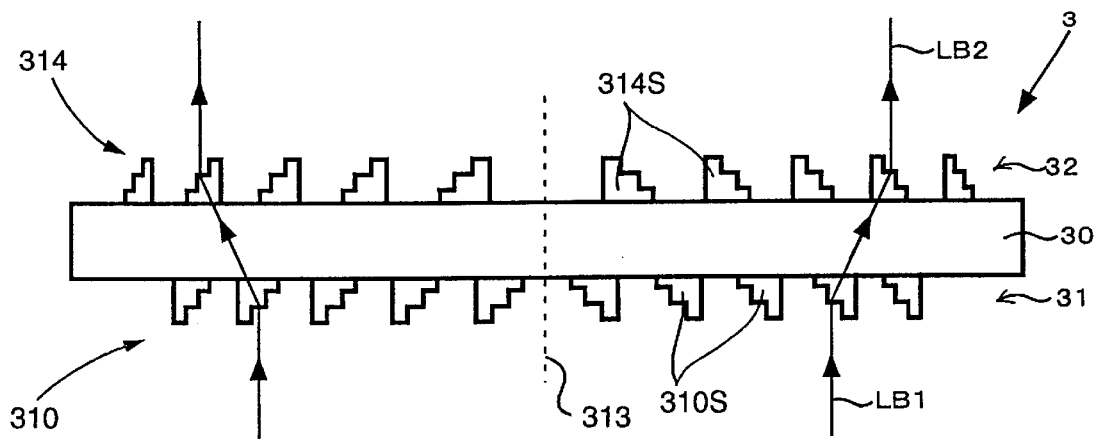
FIG. 9 is a cross sectional view taken along the line IX—IX of the optical member shown in FIGS. 7 and 8.

Referring to FIG. 9, cross sectional structure of optical member 3 will be described. FIG. 9 is a cross sectional view showing the optical member 3 cut along the line IX—IX of FIGS. 7 and 8.

Referring to FIG. 9, each stripe member 310S of hologram 310 constituting optical element 31 has a cross section of approximately righ-tangled triangle with the oblique side of the triangle having steps. Namely, each stripe member 310S is tapered stepwise. Further, each stripe member 310S is arranged such that the oblique side of the triangle faces to the center 313. Each stripe member 314S of hologram 314 constituting optical element 32 has a cross section of approximately light-angled triangle with the oblique side of the triangle having steps. More specifically, each stripe member 314S is tapered stepwise. Further, each stripe member 314S is arranged such that the oblique side of the triangle faces outward, opposite to the hologram 310.

The laser beam LB1 entering the optical member 3 is diffracted outward along the direction of the shorter diameter by the optical element 31, passes through the transparent substrate 30 and again diffracted by optical element 32 and collimated, and goes out from the optical member 3 as a laser beam LB2. As the laser beam LB1 comes to have the shorter diameter enlarged as it passes through optical member 3, the laser beam LB1 is converted to a laser beam LB2 having smaller aspect ratio.

When the laser beam is diffracted by the stepwise holograms 310 and 314 shown in FIG. 9, the light beam is converted to three beams of 0th diffraction and ±1st order diffraction. By controlling the height of each step, it is possible to take out +1st diffraction light beam with preference, by suppressing intensities of the 0th and −1st diffraction light beams. In the present embodiment, the height of each step of holograms 310 and 314 is 0.5 μm.

Figure 10:
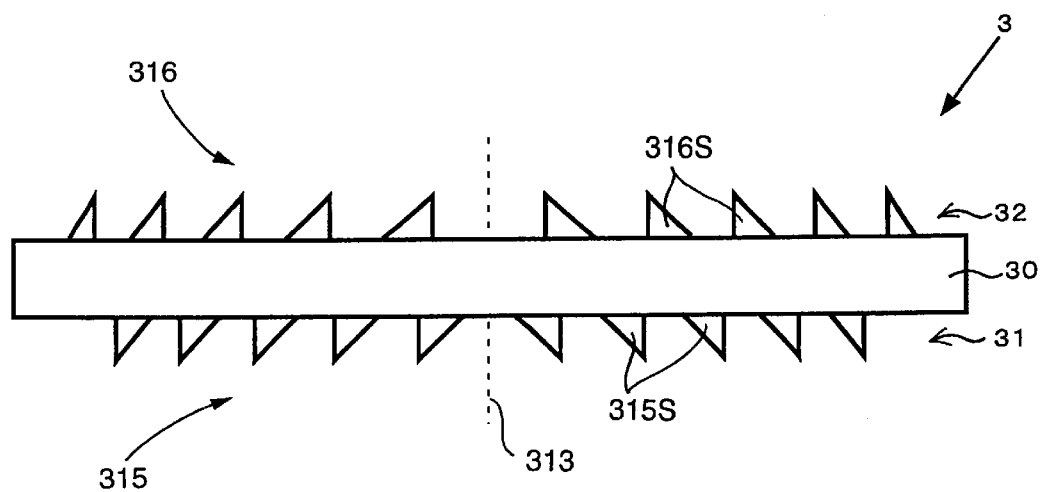
FIG. 10 is a cross sectional view showing another example of the optical member.

More preferably, optical member 3 has such a cross sectional structure as shown in FIG. 10. Referring to FIG. 10, the oblique side of the triangle of stripe members 315S and 316S of hologram lenses 315 and 316 constituting optical elements 31 and 32 respectively is linear. Namely, each of the stripe members 315S and 316S is tapered not stepwise but smooth. By using such hologram lenses 315 and 316, it becomes possible to extract almost 100% +1st order diffraction light beam, from the laser beam entering the optical member 3. As a result, the laser beam can be used with higher efficiency.

Figure 11:
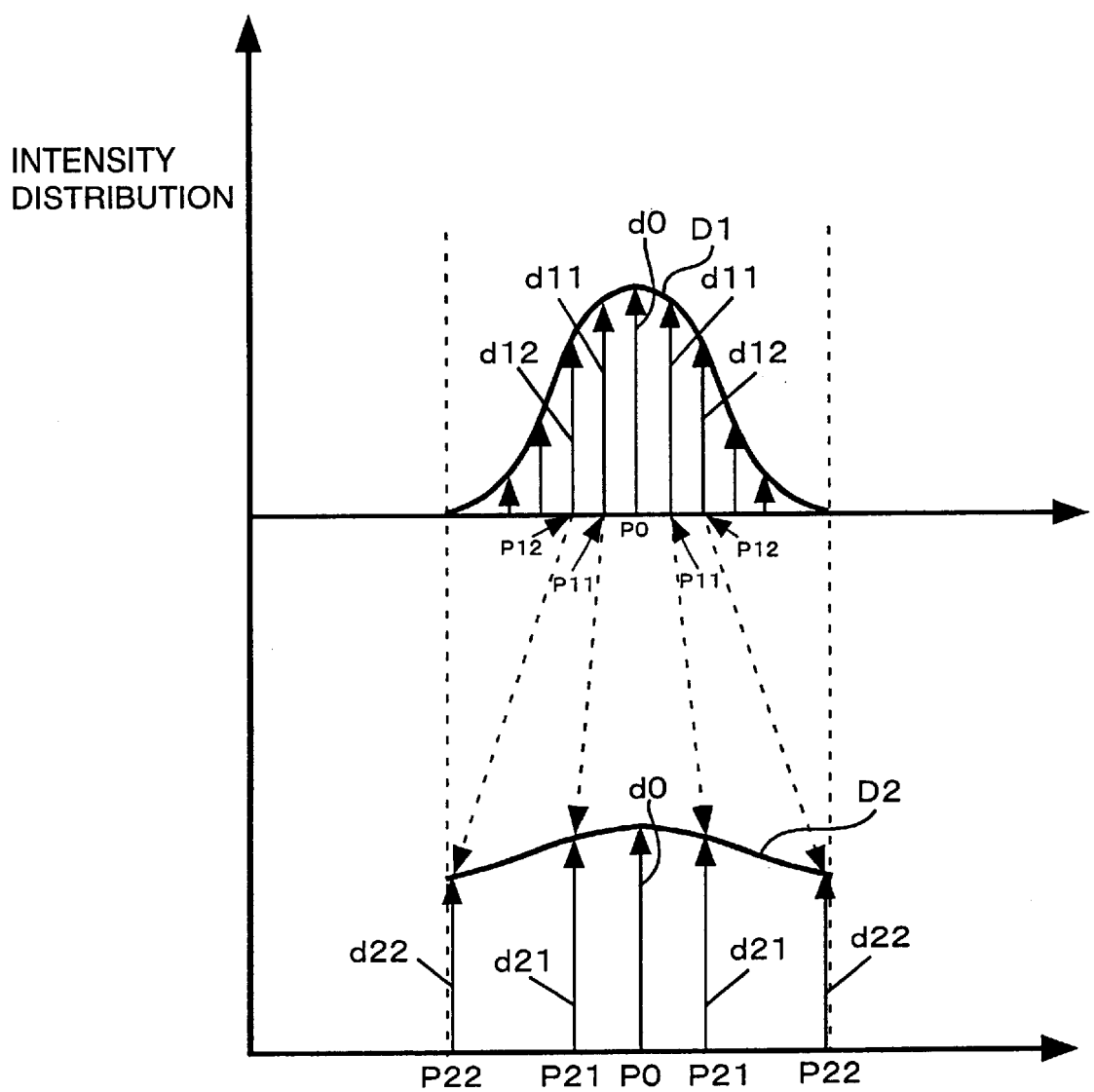
FIG. 11 represents laser beam intensity distribution before and after the entrance to the optical member.

Referring to FIG. 11, the function of optical member 3 will be described in terms of the intensity distribution along the direction of the shorter diameter of the laser beam. Before entrance to optical member 3, the laser beam has the intensity distribution D1, while the laser beam which has passed through optical member 3 has the intensity distribution D2. Components d11, d11, d12, d12 of intensity distribution D1 are at positions symmetrical with respect to the central intensity distribution component d0, and components d21, d21, d22, d22 of intensity distribution D2 are also at positions symmetrical with respect to the central intensity distribution component do. The positions p21, p21, p22, p22 at which components d21, d21, d22 and d22 exist are farther away from the central position p0 as compared with positions p11, p11, p12, p12 at which components d11, d11, d12, d12 exist. Namely, optical member 3 has a function of expanding intensity distribution of the laser beam along the direction of the shorter diameter, and therefore intensity distribution D2 of the laser beam which has passed through optical member 3 is more flat as compared with the intensity distribution D1 of the laser beam before entering the optical member 3. As a result, it becomes possible to direct the laser beam having higher intensity distribution along the shorter diameter to the objective lens 5, by the use of optical member 3, whereby the signal recording surface 8a of optical disk 8 can be irradiated with the laser beam of higher power.

Figure 12:
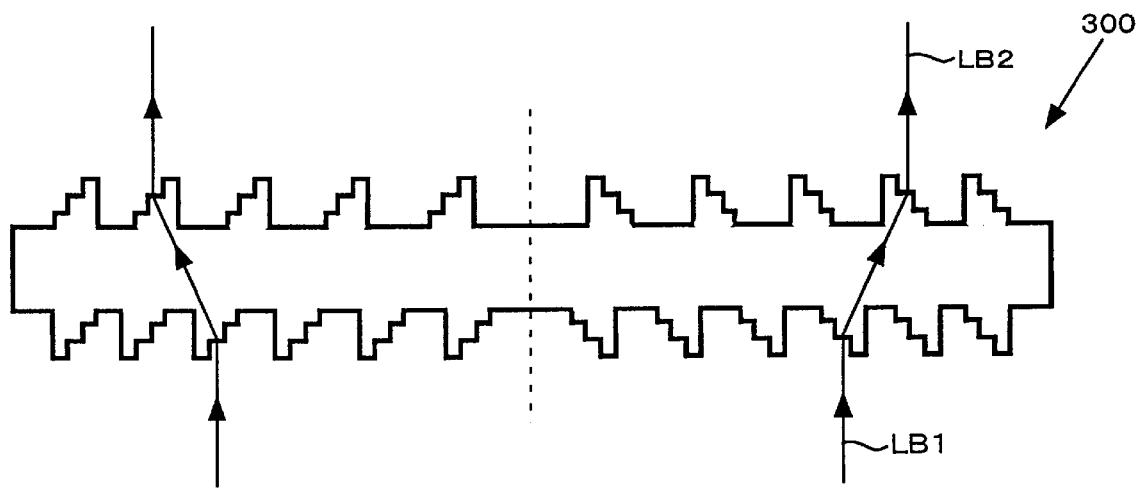
FIGS. 12 and 13 are cross sectional views showing still further examples of the optical member.
Figure 13:
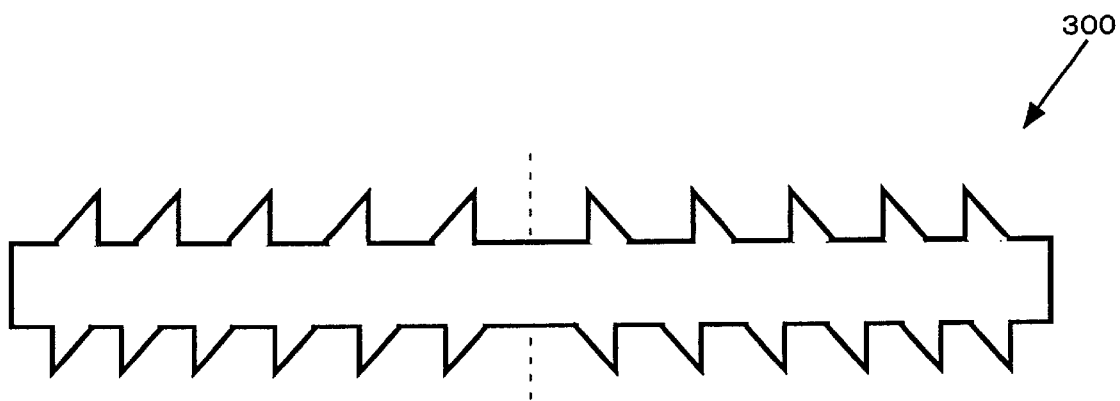

The cross sectional structure of optical member 3 is not limited to those shown in FIGS. 9 and 10, and it may be as shown in FIGS. 12 and 13. Optical member 300 shown in FIGS. 12 and 13 have transparent substrate 30 and optical elements 31 and 32 of optical member 3 shown in FIGS. 9 and 10 formed integrally. FIG. 12 shows the member in which the oblique side of the triangular hologram lens is stepwise. FIG. 13 shows the member in which the oblique side of the triangular hologram lens is linear. The laser beam LB having the prescribed aspect ratio can be obtained by using optical member 300, as the shorter diameter of the laser beam can be enlarged in the similar manner as attained by optical member 3.

In optical pickup device 10, the position of optical member 3 is not limited to the position between collimator lens 2 and halfmirror 4. It may be arranged at any position where the laser beam is in the collimated state, between collimator lens 2 and objective lens 5.

Figure 14:
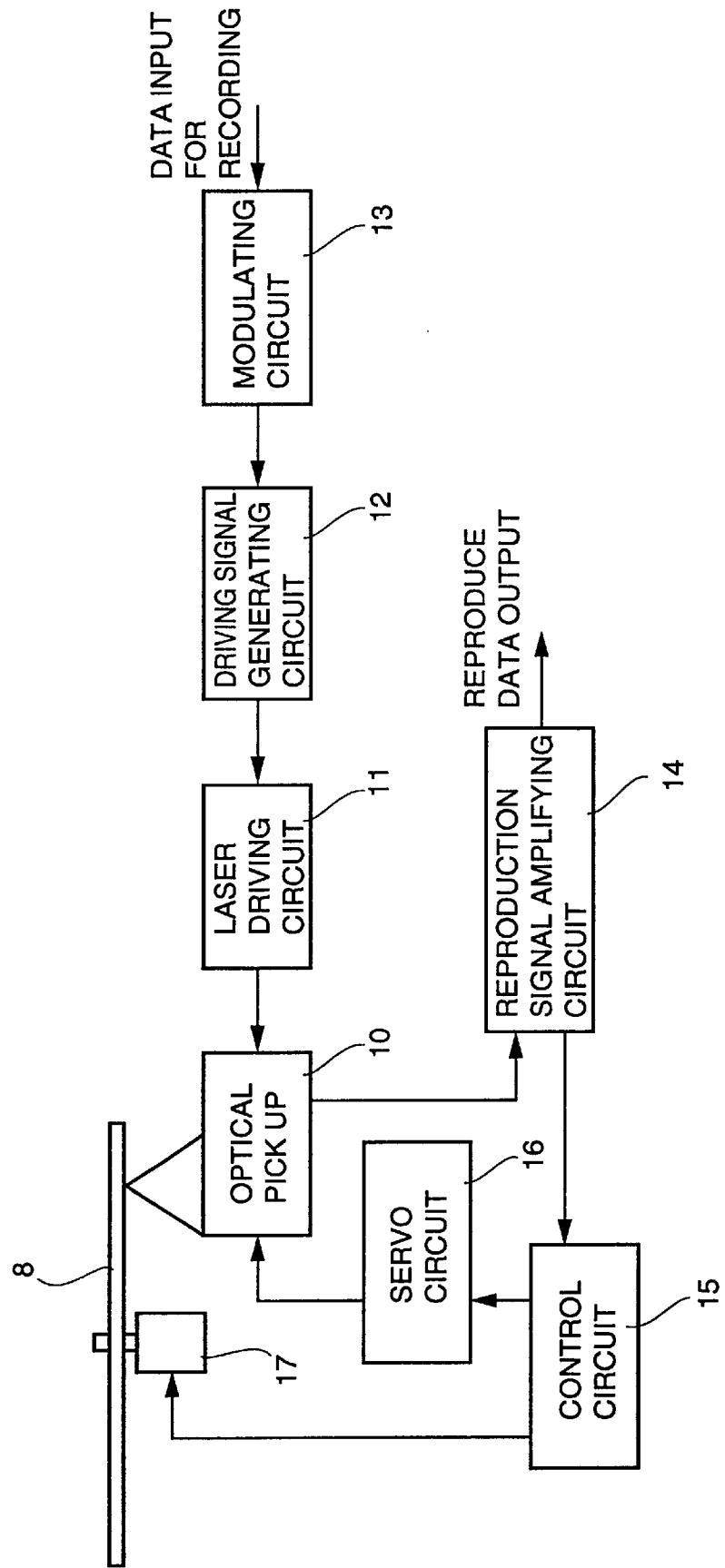
FIG. 14 is a block diagram representing an optical disk recording/reproducing apparatus using the optical pickup device shown in FIG. 5.

FIG. 14 is a block diagram showing an overall configuration of an optical disk recording/reproducing apparatus using the optical pickup device 10 described above. Referring to FIG. 14, the optical disk recording/reproducing apparatus includes optical pickup device 10, a laser driving circuit 11, a driving signal generating circuit 12, a modulating circuit 13, a reproduction signal amplifying circuit 14, a control circuit 15, a seivo circuit 16 and a spindle motor 17.

The data signal to be recorded is modulated by a prescribed method by modulating circuit 13 and applied to driving signal generating circuit 12. Based on the modulated data signal, a driving signal for driving semiconductor laser 1 in optical pickup device 10 is generated by driving signal generating circuit 12 and applied to laser driving circuit 11. In response to the driving signal, laser driving circuit 11 drives the semiconductor laser. Thus, optical pickup device 10 directs the laser beam to optical disk 8 in accordance with the data signal to be recorded. Thus, the data signal is recorded on optical disk 8.

The optical pickup device 10 reproduces a signal from optical disk 8 by directing the laser beam to optical disk 8 and detecting the reflected light therefrom. The reproduction signal is generated by photodetector 7 of optical pickup device 10 and applied to reproduction signal amplifying circuit 14. The reproduction signal is amplified by reproduction signal amplifying circuit 14, and thus the data signal is reproduced.

From optical pickup device 10, a synchronizing signal such as a fine clock mark signal, a tracking error signal, a focus error signal and the like are also applied, in addition to the reproduction signal, to reproduction signal amplifying circuit 14. These signals are amplified by reproduction signal amplifying circuit 14 and applied to control circuit 15. In response to the focus error signal and the tracking error signal, control circuit 15 controls the servo circuit 16, and in response to the synchronizing signal, controls the spindle motor 17. Servo circuit 16 performs focus servo control for objective lens 5 in optical pickup device 10 in response to the focus error signal, and performs tracking servo control for objective lens 5 in response to the tracking error signal. By the focus servo control, the objective lens 5 moves along the optical axis, whereby it becomes possible to keep the laser beam constantly focused on the signal recording surface 8a of optical disk 8. By the tracking servo control, objective lens 5 moves in the radial direction of optical disk 8, whereby it becomes possible for the laser beam to follow the tracks on the optical disk 8. The spindle motor 17 enables rotation of optical disk 8 at a prescribed rate, in response to the synchronizing signal.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An optical pickup device, comprising:
   a laser generating a laser beam having an elliptical cross section;
   an objective lens focusing said laser beam on an optical recording medium; and
   an optical member provided between said laser and said objective lens, diffracting the laser beam from said laser outward along a direction of a shorter diameter of the laser beam to enlarge only said shorter diameter and not to enlarge or contract a larger diameter of the laser beam, so as to convert the laser beam to a beam having a predetermined aspect ratio; wherein
   said optical member includes
      a first optical element diffracting said laser beam outward along the direction of the shorter diameter of the beam, and
      a second optical element collimating the beam which has been diffracted by said first optical element.

2. The optical pickup device according to claim 1, wherein
   said optical member includes a transparent substrate, said first optical element being formed on one main surface of said substrate and said second optical element being formed on the other main surface of said substrate.

3. The optical pickup device according to claim 1, further comprising a collimator lens provided between said laser and said optical member for collimating the laser beam from said laser.

4. The optical pickup device according to claim 1, wherein said first optical element includes a hologram lens consisting of a plurality of parallel stripe members each comprising a continuous un-interrupted stripe, a pitch of said stripe members being gradually made narrower outward from the center.

5. The optical pickup device according to claim 4, wherein said second optical element includes a hologram lens consisting of a plurality of stripe members, pitch of said stripe members being made gradually narrower outward from the center.

6. An optical pickup device, comprising:

a laser generating a laser beam having an elliptical cross section;

an objective lens focusing said laser beam on an optical recording medium; and an optical member provided between said laser and said objective lens, diffracting the laser beam from said laser outward along a direction of a shorter diameter of the beam so as to convert the laser beam to a laser beam having a desired aspect ratio, wherein said optical member includes a first optical element diffracting said laser beam outward along the direction of the shorter diameter of the beam, and a second optical element collimating the laser beam which has been diffracted by said first optical element, said first optical element includes a hologram lens including a plurality of stripe members, a pitch of said stripe members being gradually made narrower outward from the center; and wherein each of said stripe members has an approximately right-angled triangular cross section.

7. The optical pickup device according to claim 6, wherein each of said stripe members is tapered stepwise.

8. The optical pickup device according to claim 6, wherein each of said stripe members is tapered smooth.

9. The optical pickup device according to claim 1, wherein said first optical element diffracts the laser beam only along the direction of the shorter diameter of the beam.

10. The optical pickup device according to claim 1, wherein said second optical element diffracts the laser beam only along the direction of the shorter diameter of the beam.

* * * * *